(12) United States Patent
Stricker et al.

(10) Patent No.: US 8,163,342 B2
(45) Date of Patent: *Apr. 24, 2012

(54) METHOD OF MAKING LOW RESISITIVITY DOPED ZINC OXIDE COATINGS AND THE ARTICLES FORMED THEREBY

(75) Inventors: Jeffery L. Stricker, Narberth, PA (US); Ryan C. Smith, Collegeville, PA (US); Michael B. Abrams, Bala Cynwyd, PA (US); Roman Y. Korotkov, King of Prussia, PA (US); Gary S. Silverman, Chadds Ford, PA (US); Kevin David Sanderson, Wigan (GB); Liang Ye, Southport (GB); Guillermo Benito Gutiérrez, Ormskirk (GB)

(73) Assignees: Pilkington Group Limited, St. Helens (GB); Arkema, Inc., King of Prussia, PA (US)

( * ) Notice: Subject to any disclaimer, the term of this patent is extended or adjusted under 35 U.S.C. 154(b) by 393 days.

This patent is subject to a terminal disclaimer.

(21) Appl. No.: 11/800,410

(22) Filed: May 3, 2007

(65) Prior Publication Data
US 2008/0057225 A1 Mar. 6, 2008

Related U.S. Application Data

(60) Provisional application No. 60/840,915, filed on Aug. 29, 2006.

(51) Int. Cl.
*C23C 16/18* (2006.01)
(52) U.S. Cl. ......... 427/255.32; 427/255.23; 427/255.28; 427/255.29; 427/255.31; 427/248.1

(58) Field of Classification Search ............... None
See application file for complete search history.

(56) References Cited

U.S. PATENT DOCUMENTS

| | | | |
|---|---|---|---|
| 4,751,149 A | 6/1988 | Vijaykumar | |
| 4,928,627 A * | 5/1990 | Lindner | .............. 118/718 |
| 4,990,286 A * | 2/1991 | Gordon | .......... 252/519.14 |
| 5,342,676 A | 8/1994 | Zagdoun | |
| 6,238,738 B1 * | 5/2001 | McCurdy | ........... 427/255.19 |

(Continued)

FOREIGN PATENT DOCUMENTS

EP 0 335 769 A2 10/1989
(Continued)

OTHER PUBLICATIONS

Hu and Gordon, Solar Cells, 30 May 1991, Nos. 1/4.*

(Continued)

*Primary Examiner* — Timothy Meeks
*Assistant Examiner* — Joseph Miller, Jr.
(74) *Attorney, Agent, or Firm* — Marshall & Melhorn, LLC

(57) ABSTRACT

A low-resistivity, doped zinc oxide coated glass article is formed by providing a hot glass substrate having a surface on which a coating is to be deposited, the surface being at a temperature of at least 400° C. A zinc containing compound, an oxygen-containing compound and an aluminum- or gallium-containing compound are directed to the surface on which the coating is to be deposited. The zinc containing compound, oxygen-containing compound, and aluminum- or gallium-containing compound are mixed together for a sufficient time that an aluminum or gallium doped zinc oxide coating is formed on the surface at a deposition rate of greater than 5 nm/second.

14 Claims, 4 Drawing Sheets

U.S. PATENT DOCUMENTS

| | | | |
|---|---|---|---|
| 6,268,019 B1 | 7/2001 | Florczak | |
| 6,569,548 B2 | 5/2003 | Yamamoto | |
| 2002/0117199 A1* | 8/2002 | Oswald | 136/256 |
| 2002/0189536 A1* | 12/2002 | Otsuki et al. | 117/109 |

FOREIGN PATENT DOCUMENTS

| | | | |
|---|---|---|---|
| WO | WO93/13393 | * | 8/1993 |
| WO | WO 02/46242 A | | 6/2002 |
| WO | WO 2007/029014 | | 3/2007 |

OTHER PUBLICATIONS

Battiston, STIC abstract of article in Adv. Mater. 13(5), 2001. STIC abstract published Apr. 2001.*

Battiston, Chemical Vapor Deposition—Adv. Mater. 13(5), 2001.*

STN/STIC search report.*

Adachi, K., et al., "ZnO Films Deposited by APCVD", Proceedings of the Photovoltaic Specialists Conference, Oct. 7-11, 1991, IEEE, vol. 2, Conf. 22 (1991) pp. 1385-1388.

Choi, B. G., et al., "Electrical, optical and structural properties of transparent and conducting ZnO thin films doped with Al and F by RF magnetron sputter". Journal of the European Ceramic Society, Elsevier (Barking, GB), vol. 25, No. 12 (2005), pp. 2161-2165.

Altamirano-Juarez, D. C., et al., "Low-resistivity ZnO:F:Al transparent thin films", Solar Energy Materials and Solar Cells, Elsevier (Amsterdam,NL), vol. 82, No. 1-2 (2004) pp. 35-43.

Shunming et al., MOCVD Growth and Properties of Ga-doped ZnO Films, Chinese Journal of Semiconductors, China.

* cited by examiner

METHOD OF MAKING LOW RESISTIVITY DOPED ZINC OXIDE COATINGS AND THE ARTICLES FORMED THEREBY

RELATED APPLICATION

This application is claiming the benefit, under 35 U.S.C. 119(e), of the provisional application filed Aug. 29, 2006 under 35 U.S.C. 111 (b), which was granted Ser. No. 60/840,915. This provisional application is hereby incorporated by reference.

BACKGROUND

The present invention is related to a method of depositing a doped zinc oxide coating on a transparent substrate, more particularly, it is related to a chemical vapor deposition method of depositing a gallium or aluminum doped zinc oxide coating on a glass substrate.

U.S. Pat. No. 5,342,676 teaches a glass substrate provided with a conducting, low-emissivity transparent functional film, based upon metal oxide or oxides, on which is deposited an "outer" coating. Aluminum doped zinc oxide is given as an example of such a film.

U.S. Pat. No. 6,569,548 discloses the formation of a transparent conductive zinc oxide film having an electrical resistivity lower than tin-doped indium oxide (ITO) by doping the zinc oxide coating with nitrogen and gallium.

It would be desirable to be able to make gallium or aluminum doped zinc oxide films at high deposition rates by atmospheric pressure chemical vapor deposition during the float glass manufacturing process, utilizing relatively inexpensive precursor materials, and producing coated glass articles with desirable low resistivity properties.

It would also be desirable to make gallium or aluminum doped zinc oxide films at high deposition rates by atmospheric pressure chemical vapor deposition onto polymeric substrates, utilizing relatively inexpensive precursor materials, and producing coated articles with desirable low resistivity properties.

SUMMARY OF THE INVENTION

The present invention provides an atmospheric pressure chemical vapor deposition method for depositing a gallium or aluminum doped zinc oxide coating on a hot glass substrate. The method provides a hot glass substrate having a surface on which a coating is to be deposited, the surface being at a temperature of at least 400° C. A zinc containing compound, an oxygen-containing compound and an aluminum or gallium containing compound are directed to the surface on which the coating is to be deposited. The zinc containing compound, an oxygen-containing compound and aluminum or gallium containing compound are mixed together for a sufficient time that an aluminum or gallium doped zinc oxide coating is formed on the surface at a deposition rate of greater than 5 nm/second.

BRIEF DESCRIPTION OF THE DRAWINGS

The accompanying drawings, incorporated in, and forming a part of the specification, illustrate several aspects of the invention, and together with the description, serve to explain the principles of the invention.

DETAILED DESCRIPTION OF THE INVENTION

Figure 1:
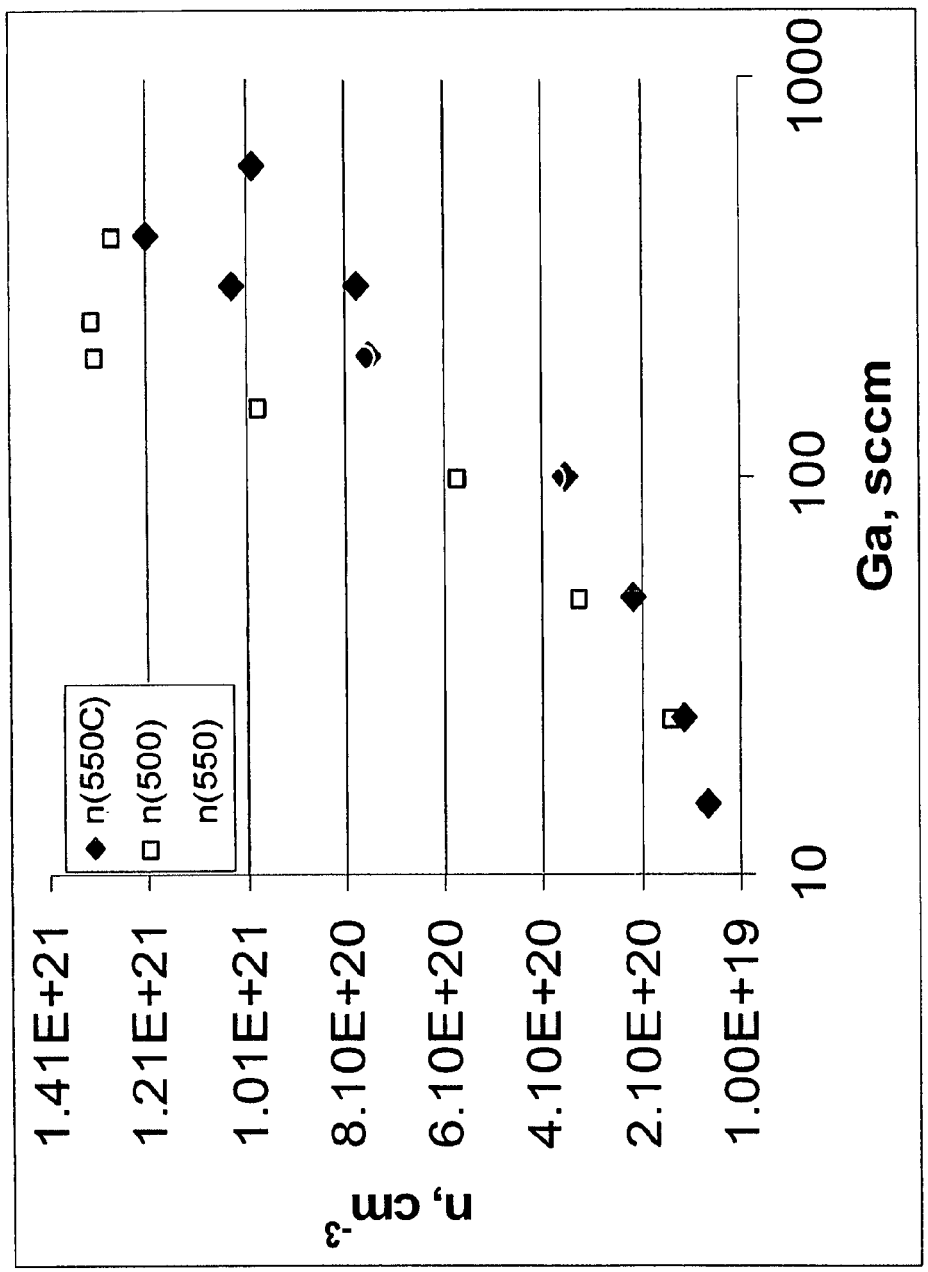
FIG. 1 is a graphical representation of the electron concentration (n) of the zinc oxide film vs gallium concentration (flow rate), of the several Examples, in accordance with the invention.

While zinc oxide coatings and deposition methods are known, cost effective methods of making pyrolytic doped zinc oxide coatings at commercially viable growth rates, during the glass making process on a float glass manufacturing line, have not previously been known. The present invention overcomes the previous obstacles of making such zinc oxide films at commercially viable growth rates.

While any suitable method of atmospheric pressure chemical vapor deposition may be utilized in connection with the present invention, the method of deposition disclosed in U.S. Pat. No. 6,268,019 to Atofina Chemicals, Inc. is preferred. The '019 patent is incorporated herein by reference, in its entirety. The method of the '019 patent has been shown to be capable of depositing metal oxide films of various kinds, at commercially useful growth rates, for example, at greater than 5 nm/sec. The deposition method of the '019 patent also has the advantage of being able to vary the mixing time of the reactant materials which, in turn, allows "tuning" of the properties of, in this instance, zinc oxide coatings. In particular, the present invention demonstrates the benefits of utilizing gallium or aluminum as dopants to produce a doped zinc oxide layer.

Such zinc oxide coated glass products are useful as low emissivity and/or solar control layers in architectural window applications. Other potential applications of this transparent conducting oxide include: photovoltaic devices, solid-state lighting (LEDs and OLEDS), induction heating, flat panel displays and touch panel screens, transparent thin film transistors (TFT) that have applications in RFID tags and integrated circuits.

Suitable zinc containing compounds include, but are not limited to compounds of the general formula $R^1R^2Zn$ or $R^1R^2Zn$—$[R^3R^4N(CHR^5)_n(CH_2)_m(CHR^6)_nNR^7R^8]$, where $R^{1-8}$ can be the same or different alkyl or aryl groups such as methyl, ethyl, isopropyl, n-propyl, n-butyl, sec-butyl, phenyl or substituted phenyl, and may include one or more fluorine-containing substituents, $R^5$ and $R^6$ can be H or alkyl or aryl groups, n can be 0 or 1, and m can be 1-6 if n is 0, and m can be 0-6 if n is 1. Preferred zinc containing compounds include diethyl and dimethyl zinc adducts (such as) diethylzinc.TEEDA (TEEDA=N,N,N',N'-tetraethyl ethylenediamine), diethylzinc.TMEDA (TMEDA=N,N,N',N'-tetramethyl ethylenediamine), diethylzinc.TMPDA (TMPDA=N,N,N',N'-tetramethyl-1,3-propanediamine), dimethylzinc.TEEDA, dimethylzinc.TMEDA, and dimethylzinc.TMPDA.

Suitable group 13 metal containing precursors include those of the general formula $R^9_{(3-n)}M(R^{10}C(O)CR^{11}C(O)R^{12})_n$ or $R^9_3M(L)$ wherein M=B, Al, Ga, In or Tl, $R^9$ is an alkyl or aryl or halide or alkoxide group, $R^{10-12}$ may be the same or different and are H, alkyl, or aryl groups (including cyclic and partially- and perfluorinated derivatives), n=0-3, and L=a neutral ligand capable of coordinating to the metal. A preferred gallium containing precursor is dimethylgallium-hexafluoroacetylacetonate (commonly referred to as $Me_2Ga$ (hfac)). Other suitable gallium containing precursors include diethylgallium(hexafluoroacetylacetonate), trimethylgallium, trimethylgallium(tetrahydrofuran), triethylgallium(tetrahydrofuran), dimethylgallium(2,2,6,6-tetramethyl-3,5-heptanedionate), dimethylgallium(acetylacetonate), tris(acetylacetonate)gallium, tris(1,1,1-trifluoroacetylacetonate)gallium, tris(2,2,6,6-tetramethyl-3,5-heptanedionate)gallium and triethylgallium. Other gallium containing compounds may be suitable for use as precursors in the present invention.

Suitable aluminum containing precursors include $R^1{}_{3-n}AlR^2{}_n$ and $R^1{}_3Al(L)$, where $R^1$ is methyl, ethyl, n-propyl, isopropyl, n-butyl, isobutyl, or octyl, $R^2$ is a halide or substituted or unsubstituted acetylaetonate derivative, including partially- and perfluorinated derivatives, n is 0-3, and L is a neutral ligand capable of coordinating to aluminum. Preferred aluminum containing precursors include diethyl aluminum acetylacetonate ($Et_2Al(acac)$), diethylaluminum chloride, diethylaluminum(hexafluoroacetylacetonate), diethylaluminum(1,1,1-trifluoroacetylacetonate), diethylaluminum(2,2,6,6-tetramethyl-3,5-heptanedionate), triethylaluminum, tris(n-butyl)aluminum, and triethylaluminum(tetrahydrofuran). Other aluminum containing compounds may be suitable for use as precursors in the present invention.

Suitable oxygen containing compounds include, but are not limited to: organic acetates, for example, ethyl acetate (EtOAc) or t-butylacetate, alcohols (including perfluorinated derivatives), oxygen, and water, with $H_2O$ being preferred.

An inert carrier gas, such as nitrogen, helium or the like may also be utilized as a component of the gaseous reactant stream of the present invention.

Temperatures found to be suitable to allow the desired chemical reactions to take place are >400° C., in particular, 500° C.-700° C.

ZnO:Ga films formed according to the method of the present invention can exhibit resistivities as low as 3.0 e-4 ohm-cm, with carrier mobilities of up to 15 $cm^2/(Vs)$ and electron concentrations of up to 1.1 e21 $cm^{-3}$.

ZnO:Al films deposited according to the present invention can exhibit resistivities of as low as 5.59 e-4 ohm-cm, carrier mobilities of up to 19 $cm^2/(Vs)$ and electron concentrations of up to 5.93 e20 $cm^{-3}$.

The following non-limiting examples illustrate certain aspects of the present invention.

EXAMPLES

It has been found that the utilization of $H_2O$ at a relatively high proportion of the gas mixture reacts quickly and efficiently with suitable zinc precursor materials to produce zinc oxide films at commercially useful rates.

The APCVD apparatus used in examples 1-8 is similar to that described in U.S. Pat. No. 6,268,019 B1. A key feature of the apparatus is the ability to control the mixing time of the gaseous reagents by feeding the vapors separately to the coating nozzle. In these experiments the coating nozzle consisted of concentric tubes: a ¼" secondary tube fed into a ¾" primary tube via compression fitting that allows the length of the mixing zone to be adjusted, and an outer ~1.25" tube connected to an exhaust blower for removal of by-products and unreacted vapors. The films resulting from this nozzle configuration were circular with diameter approximately ⅞".

The APCVD apparatus used in Examples 9-11 and 13 consists of a single slot coater which contains a mixing chamber where two separate precursor streams can be combined controllably prior to contacting the substrate surface. The mixing chamber is 1.25-inch in length. For total nitrogen carrier gas flow of 15 L/min the mixing time of the two precursor streams is approximately 280 milliseconds. Deposition by-products and unreacted precursor vapors are removed via two exhaust slots (adjacent to the coating slot) connected to an exhaust blower. The films resulting from this nozzle are approximately 4-inch in width. Heated substrates may be transported below the nozzle to coat various lengths.

The APCVD apparatus used in Example 12 was conducted on a dynamic coater, in which the preheated substrates of 3 or 4 mm think glass was moving closely underneath a metal coater head, where the chemical mixture of gases is directed to contact a hot glass substrate at 600° C. and extracted immediately afterwards. A gas mixture as described below was premixed in the chemical delivery trolley and fed through a heated delivery tube into the coater head. With reference to the chemical flow condition and experimental physical dimension, the reactant mixing time is calculated to be longer than 1 second before reaching the heated glass. The coating deposition time, defined as duration of glass passing under the effective chemical deposition region, was approximately 15 seconds.

Example 1

$Me_2Ga(hfac)$ (hfac=hexafluoroacetylacetonate, $F_3CC(O)CHC(O)CF_3$) was dissolved in anhydrous heptane to make a 0.58M solution to allow for precise controlled injection of Ga precursor. A set of ZnO:Ga films was deposited from 0.289 mol % $Et_2Zn.TEEDA$ (TEEDA=N,N,N',N'-tetraethylethylenediamine) and 0.012 mol % $Me_2Ga(hfac)$ in 12 slpm of nitrogen carrier gas, fed into the primary feed tube at a temperature of 160° C. In the secondary feed tube, a gas mixture of 13.8 mol % water in 3 slpm nitrogen was fed at a temperature of 160° C. The secondary nozzle was inserted to allow for a mixing zone length of 18 cm, corresponding to a mixing time of ~97 msec between the primary and secondary feed streams. The substrate used for deposition was borosilicate float glass with a thickness of 1.1 mm. The substrate was heated on a resistively heated nickel block set at 675° C. The substrate temperature was recorded as 650° C. by an infrared pyrometer. The deposition time for the films was 20 seconds, and the resulting doped-ZnO films had a thickness of 566 nm. The Hall resistivity for this film averaged 4.5 e-4 ohm-cm, the mobility measured 15.0 $cm^2/(Vs)$, and the electron concentration measured 9.22 e20 $cm^{-3}$.

Example 2

A set of ZnO:Al films was deposited from 0.289 mol % $Et_2Zn.TEEDA$ and 0.025 mol % $Et_2Al(acac)$ (acac=acetylacetonate, $H_3CC(O)CHC(O)CH_3$) in 12 slpm of nitrogen carrier gas, fed into the primary feed tube at a temperature of 160° C. In the secondary feed tube, a gas mixture of 6.92 mol % water in 3 slpm nitrogen was fed at a temperature of 160° C. The secondary nozzle was inserted to allow for a mixing zone length of 18 cm, corresponding to a mixing time of ~97 msec between the primary and secondary feed streams. The substrate used for deposition was borosilicate float glass with a thickness of 1.1 mm. The substrate was heated on a resistively heated nickel block set at 375° C. The substrate temperature was recorded as 350° C. by an infrared pyrometer. The deposition time for the films was 20 seconds, and the resulting doped-ZnO films had a thickness of 637 nm. The Hall resistivity for this film averaged 3.83 e-2 ohm-cm, the mobility measured 0.43 $cm^2/(Vs)$, and the electron concentration measured 3.78 e20 $cm^{-3}$.

Example 3

A set of ZnO:Al films was deposited from 0.289 mol % Et$_2$Zn.TEEDA and 0.025 mol % Et$_2$Al(acac) in 12 slpm of nitrogen carrier gas, fed into the primary feed tube at a temperature of 160° C. In the secondary feed tube, a gas mixture of 6.92 mol % water in 3 slpm nitrogen was fed at a temperature of 160° C. The secondary nozzle was inserted to allow for a mixing zone length of 18 cm, corresponding to a mixing time of ~97 msec between the primary and secondary feed streams. The substrate used for deposition was borosilicate float glass with a thickness of 1.1 mm. The substrate was heated on a resistively heated nickel block set at 475° C. The substrate temperature was recorded as 450° C. by an infrared pyrometer. The deposition time for the films was 20 seconds, and the resulting doped-ZnO films had a thickness of 616 nm. The Hall resistivity for this film averaged 1.32 e-3 ohm-cm, the mobility measured 16.4 cm$^2$/(Vs), and the electron concentration measured 2.89 e20 cm$^{-3}$.

Example 4

A set of ZnO:Al films was deposited from 0.289 mol % Et$_2$Zn.TEEDA and 0.025 mol % Et$_2$Al(acac) in 12 slpm of nitrogen carrier gas, fed into the primary feed tube at a temperature of 160° C. In the secondary feed tube, a gas mixture of 6.92 mol % water in 3 slpm nitrogen was fed at a temperature of 160° C. The secondary nozzle was inserted to allow for a mixing zone length of 18 cm, corresponding to a mixing time of ~97 msec between the primary and secondary feed streams. The substrate used for deposition was borosilicate float glass with a thickness of 1.1 mm. The substrate was heated on a resistively heated nickel block set at 525° C. The substrate temperature was recorded as 500° C. by an infrared pyrometer. The deposition time for the films was 20 seconds, and the resulting doped-ZnO films had a thickness of 646 nm. The Hall resistivity for this film averaged 5.59 e-4 ohm-cm, the mobility measured 19.0 cm$^2$/(Vs), and the electron concentration measured 5.93 e20 cm$^{-3}$.

Example 5

A set of ZnO:Al films was deposited from 0.289 mol % Et$_2$Zn.TEEDA and 0.025 mol % Et$_2$Al(acac) in 12 slpm of nitrogen carrier gas, fed into the primary feed tube at a temperature of 160° C. In the secondary feed tube, a gas mixture of 6.92 mol % water in 3 slpm nitrogen was fed at a temperature of 160° C. The secondary nozzle was inserted to allow for a mixing zone length of 18 cm, corresponding to a mixing time of ~97 msec between the primary and secondary feed streams. The substrate used for deposition was borosilicate float glass with a thickness of 1.1 mm. The substrate was heated on a resistively heated nickel block set at 575° C. The substrate temperature was recorded as 550° C. by an infrared pyrometer. The deposition time for the films was 20 seconds, and the resulting doped-ZnO films had a thickness of 453 nm. The Hall resistivity for this film averaged 1.43 e-3 ohm-cm, the mobility measured 15.5 cm$^2$/(Vs), and the electron concentration measured 2.80 e20 cm$^{-3}$.

Example 6

A set of ZnO:Al films was deposited from 0.289 mol % Et$_2$Zn.TEEDA and 0.025 mol % Et$_2$Al(acac) in 12 slpm of nitrogen carrier gas, fed into the primary feed tube at a temperature of 160° C. In the secondary feed tube, a gas mixture of 6.92 mol % water in 3 slpm nitrogen was fed at a temperature of 160° C. The secondary nozzle was inserted to allow for a mixing zone length of 18 cm, corresponding to a mixing time of ~97 msec between the primary and secondary feed streams. The substrate used for deposition was borosilicate float glass with a thickness of 1.1 mm. The substrate was heated on a resistively heated nickel block set at 675° C. The substrate temperature was recorded as 650° C. by an infrared pyrometer. The deposition time for the films was 20 seconds, and the resulting ZnO films had a thickness of 375 nm. The Hall resistivity for this film averaged 3.63 e-3 ohm-cm, the mobility measured 6.9 cm$^2$/(Vs), and the electron concentration measured 2.50 e20 cm$^{-3}$.

Example 7

A set of ZnO films was deposited from 0.289 mol % Et$_2$Zn.TEEDA and 0.025 mol % Et$_2$Al(acac) in 12 slpm of nitrogen carrier gas, fed into the primary feed tube at a temperature of 160° C. In the secondary feed tube, a gas mixture of 6.92 mol % water in 3 slpm nitrogen was fed at a temperature of 160° C. The secondary nozzle was inserted to allow for a mixing zone length of 18 cm, corresponding to a mixing time of ~97 msec between the primary and secondary feed streams. The substrate used for deposition was borosilicate float glass with a thickness of 1.1 mm. The substrate was heated on a resistively heated nickel block set at 725° C. The substrate temperature was recorded as 700° C. by an infrared pyrometer. The deposition time for the films was 20 seconds, and the resulting films had a thickness of 496 nm. The Hall resistivity for this film averaged 6.18 ohm-cm, the mobility measured 0.21 cm$^2$/(Vs), and the electron concentration measured 4.80 e18 cm$^{-3}$.

Example 8

A set of ZnO films was deposited from 0.289 mol % Et$_2$Zn.TEEDA in 12 slpm of nitrogen carrier gas, fed into the primary feed tube at a temperature of 160° C. In the secondary feed tube, a gas mixture of 13.8 mol % water in 3 slpm nitrogen was fed at a temperature of 160° C. The secondary nozzle was inserted to allow for a mixing zone length of 18 cm, corresponding to a mixing time of ~97 msec between the primary and secondary feed streams. The substrate used for deposition was borosilicate float glass with a thickness of 1.1 mm. The substrate was heated on a resistively heated nickel block set at 675° C. The substrate temperature was recorded as 650° C. by an infrared pyrometer. The deposition time for the films was 20 seconds, and the resulting ZnO films had a thickness of 439 nm. These films exhibited very high resistivities, above 10 ohm-cm.

Example 9

A gas mixture of 0.43 mol % of Et$_2$Zn.TMPDA (TMPDA=N,N,N',N'-tetramethylpropane-1,3-diamine) in 6 slpm of nitrogen carrier gas was fed into a primary feed tube at 170° C. The dopant was introduced into the primary feed tube from a stainless steel bubbler. The bubbler contained Me$_2$Ga(acac) at 34.8° C. The Ga-precursor was picked up by preheated (60° C.) nitrogen with a flow rate of 410 sccm. In a secondary feed tube, a gas mixture of 0.26 mol % of H$_2$O and 4.06 mol % of 2-Butanol in 4 slpm of nitrogen was fed at 170° C. The secondary feeds were co-fed with the primary flow inside a mixing chamber. The mixing chamber was 1¼ inch in length, corresponding to a mixing time of 417 msec between the primary and secondary feed streams. The substrate used for the deposition was borosilicate glass with the thickness of 0.7 mm. The substrate was heated on a resistively heated nickel block set at 500° C. The film was deposited in a dynamic mode resulting in ZnO films with thickness of 694 nm, for a deposition rate of 9.3 nm/s. The haze for these films averaged 0.4% as measured by BYK HazeGuard Plus hazemeter. The resistivity, mobility and electron concentration were 1.97 e-4 ohm-cm, 23 cm$^2$/(Vs) and 1.36 e21 cm$^{-3}$, respectively.

Example 10

A gas mixture of 0.48 mol % of Me$_2$Zn.TMPDA in 10 slpm of nitrogen carrier gas was fed into a primary feed tube at 170° C. The dopant was introduced into the primary feed tube from a stainless steel bubbler. The bubbler contained Me$_2$Ga(acac) at 42.8° C. Ga-precursor was picked up by preheated (60° C.) nitrogen with a flow rate of 210 sccm. In a secondary feed tube, a gas mixture of 0.415 mol % of H$_2$O and 3.26 mol % of 2-Butanol in 5 slpm of nitrogen was fed at 170° C. The secondary feeds were co-fed with the primary flow inside a mixing chamber. The mixing chamber was 1¼ inch in length, corresponding to a mixing time of 278 msec between the primary and secondary feed streams. The substrate used for the deposition was borosilicate glass with the thickness of 0.7 mm. The substrate was heated on a resistively heated nickel block set at 550° C. The deposition time for these films was 55 seconds in a static mode, and resulting ZnO films had a thickness of 725 nm, for a deposition rate of 13.2 nm/s. The haze for these films averaged 2.6-2.7% as measured by BYK HazeGuard Plus hazemeter. The resistivity, mobility and electron concentration were 2.1 e-4 ohm-cm, 22.4 cm$^2$/(Vs) and 1.32 e21 cm$^{-3}$, respectively.

Example 11

A gas mixture of 0.43 mol % of Et$_2$Zn.TMPDA in 6 slpm of nitrogen carrier gas was fed into a primary feed tube at 170° C. The dopant was introduced into the primary feed tube from a stainless steel bubbler. The bubbler contained Me$_2$Ga(acac) at 34.8° C. Ga-precursor was picked up by preheated (60° C.) nitrogen with a flow rate of 410 sccm. In a secondary feed tube, a gas mixture of 0.26 mol % of H$_2$O and 4.06 mol % of 2-Butanol in 4 slpm of nitrogen was fed at 170° C. The secondary feeds were co-fed with the primary flow inside a mixing chamber. The mixing chamber was 1¼ inch in length, corresponding to a mixing time of 417 msec between the primary and secondary feed streams. The substrate used for the deposition was borosilicate glass with the thickness of 0.7 mm. The substrate was heated on a resistively heated nickel block set at 500° C. The film was deposited in a dynamic mode resulting in ZnO films with thickness 718 nm, for a deposition rate of 9.6 nm/s. The haze for these films averaged 0.5% as measured by BYK HazeGuard Plus hazemeter. The resistivity, mobility and electron concentration were 2.14 e-4 ohm-cm, 18.4 cm$^2$/(Vs) and 1.58 e21 cm$^{-3}$, respectively.

Example 12

A gas mixture of DEZ, IPA and N$_2$ was premixed in the chemical delivery trolley and fed through a heated delivery tube into the coater head. The trimethylgallium (TMGa) at a flow rate of 0.025 slpm and bubbler temperature of 5° C. is carried by N$_2$ gas at a flow rate of 0.06 slpm and joins the DEZ (flow rate 0.347 slpm, bubbler temperature 85° C.) in N$_2$ carrier gas at 0.9 slpm and IPA (flow rate 0.508 slpm, bubbler temperature 58° C.) in N$_2$ carrier gas at 1 slpm and balance N$_2$ gas of 10 slpm, 20 cm above the coater head. The coating deposition time, defined as the duration of glass passing under the effective chemical deposition region, is approximately 15 seconds.

The resulting Ga doped zinc oxide is about 280 nm in thickness and the measured sheet resistance is 55 ohm/sq by 4 point probe. It has been observed that adding TMGa will reduce the coating deposition rate, while improving coating uniformity.

Example 13

A gas mixture of 0.48 mol % of ZnEt$_2$TMPDA in 10 slpm of nitrogen carrier gas was fed into a primary feed tube at 170° C. The Al and Ga dopants were introduced into the primary feed tube from a stainless steel bubbler. The bubbler containing AlEt$_2$acac was set at 90° C. Al-precursor was picked up by nitrogen preheated to 95° C. at 500 sccm. The bubbler containing GaMe$_2$acac was set at 50° C. The Ga-precursor was picked up by nitrogen preheated to 60° C. with a flow rate of 150 sccm. In a secondary feed tube, a gas mixture of 0.21 mol % of H$_2$O and 4.06 mol % of 2-Butanol in 4 slpm of nitrogen was fed at 170° C. The secondary feeds were co-fed with the primary flow inside a mixing chamber. The mixing chamber was 1¼ inch in length, corresponding to a mixing time of 417 msec between the primary and secondary feed streams. The substrate used for the deposition was borosilicate glass with the thickness of 0.7 mm. The substrate was heated on resistively heated nickel block set at 520° C. The film was deposited in a dynamic mode resulting in ZnO films with thickness of 734 nm, for a deposition rate of 13.8 nm/s. The haze for these films averaged 0.6% as measured by BYK HazeGuard Plus hazemeter. The resistivity, mobility and electron concentration were $1.07 \times 10^{-3}$ ohm-cm, 6.5 cm$^2$/Vs and $8.85 \times 10^{20}$ cm$^{-3}$, respectively.

TABLE 1

| Example | Zn Precursor | Dopant Precursor | Oxygen Precursor (mol %) | [Zn Precursor], mol % | Dopant N$_2$ flow rate, sccm (T, ° C.) |
|---|---|---|---|---|---|
| 1 | Et$_2$Zn (TEEDA) | Me$_2$Ga(acac) | H$_2$O (13.8) | 0.289 | |
| 2 | Et$_2$Zn (TEEDA) | Et$_2$Al(acac) | H$_2$O (6.92) | 0.289 | |
| 3 | Et$_2$Zn (TEEDA) | Et$_2$Al(acac) | H$_2$O (6.92) | 0.289 | |
| 4 | Et$_2$Zn (TEEDA) | Et$_2$Al(acac) | H$_2$O (6.92) | 0.289 | |
| 5 | Et$_2$Zn (TEEDA) | Et$_2$Al(acac) | H$_2$O (6.92) | 0.289 | |
| 6 | Et$_2$Zn (TEEDA) | Et$_2$Al(acac) | H$_2$O (6.92) | 0.289 | |
| 7 | Et$_2$Zn (TEEDA) | Et$_2$Al(acac) | H$_2$O (6.92) | 0.289 | |
| 8 | Et$_2$Zn (TEEDA) | Et$_2$Al(acac) | H$_2$O (13.8) | 0.289 | |
| 9 | Et$_2$Zn (TMPDA) | Me$_2$Ga(acac) | 2-Butanol (4.06) + H$_2$O (0.26) | 0.43 | 410 (35) |
| 10 | Me$_2$Zn (TMPDA) | Me$_2$Ga(acac) | 2-Butanol (4.06) + H$_2$O (0.42) | 0.48 | 210 (43) |
| 11 | Et$_2$Zn (TMPDA) | Me$_2$Ga(acac) | 2-Butanol (4.06) + H$_2$O (0.26) | 0.43 | 410 (35) |
| 12 | Et$_2$Zn | TMGa | IPA (3.95) | 2.7 | |

| Example | [Dopant], mol % | Substrate Temp, ° C. | Film thickness, nm | Deposition rate, nm/sec | Resistivity, Ohm-cm |
|---|---|---|---|---|---|
| 1 | 0.0120 | 650 | 566 | 28.3 | 4.5e-4 |
| 2 | 0.025 | 350 | 646 | 32.3 | 3.82e-2 |
| 3 | 0.025 | 450 | 616 | 30.8 | 5.59e-4 |
| 4 | 0.025 | 500 | 646 | 32.3 | 5.59e-4 |
| 5 | 0.025 | 550 | 453 | 22.65 | 1.43e-3 |
| 6 | 0.025 | 650 | 375 | 18.75 | 1.37e-3 |
| 7 | 0.025 | 700 | 496 | 24.8 | 6.18 |

TABLE 1-continued

| | | | | | |
|---|---|---|---|---|---|
| 8 | 0 | 650 | 439 | 21.95 | >10 |
| 9 | | 500 | 680 | 9.3 | 1.97e−4 |
| 10 | | 550 | 725 | 13.2 | 2.1e−4 |
| 11 | | 500 | 718 | 9.6 | 2.1e−4 |
| 12 | 0.19 | 600 | 280 | 18.67 | 1.54e−3 |

Table 1 summarizes the deposition conditions utilized and resultant resistivities for Examples 1-12. Examples 1 and 9-12 describe the deposition of Ga-doped zinc oxide, Examples 2-7 describe the deposition of Al-doped zinc oxide. All examples demonstrate a clear improvement in the resistivity over that achieved from an undoped ZnO coating (Example 8). The Examples all demonstrate commercially viable growth rates of greater than 5 nm/sec, with growth rates greater than 30 nm/sec achieved in Examples 2-4. Examples 2-7 demonstrate the effect of substrate temperature at fixed aluminium- and zinc-precursor gas phase concentrations. In all cases growth rates significantly greater than 5 nm/sec are achieved, with deposition demonstrated over the wide temperature window of 350-700° C.

Example 13 describes deposition of co-doped Al-, Ga-zinc oxide, which also resulted in coating growth rates greater than 5 nm/sec and reasonably low resistivity.

Both the film resistivity and growth rate are dependent on both the deposition temperature, and on the gas phase concentration of the dopant precursor; these two variables may be "tuned" in order to optimize film resistivity)

Figure 2:
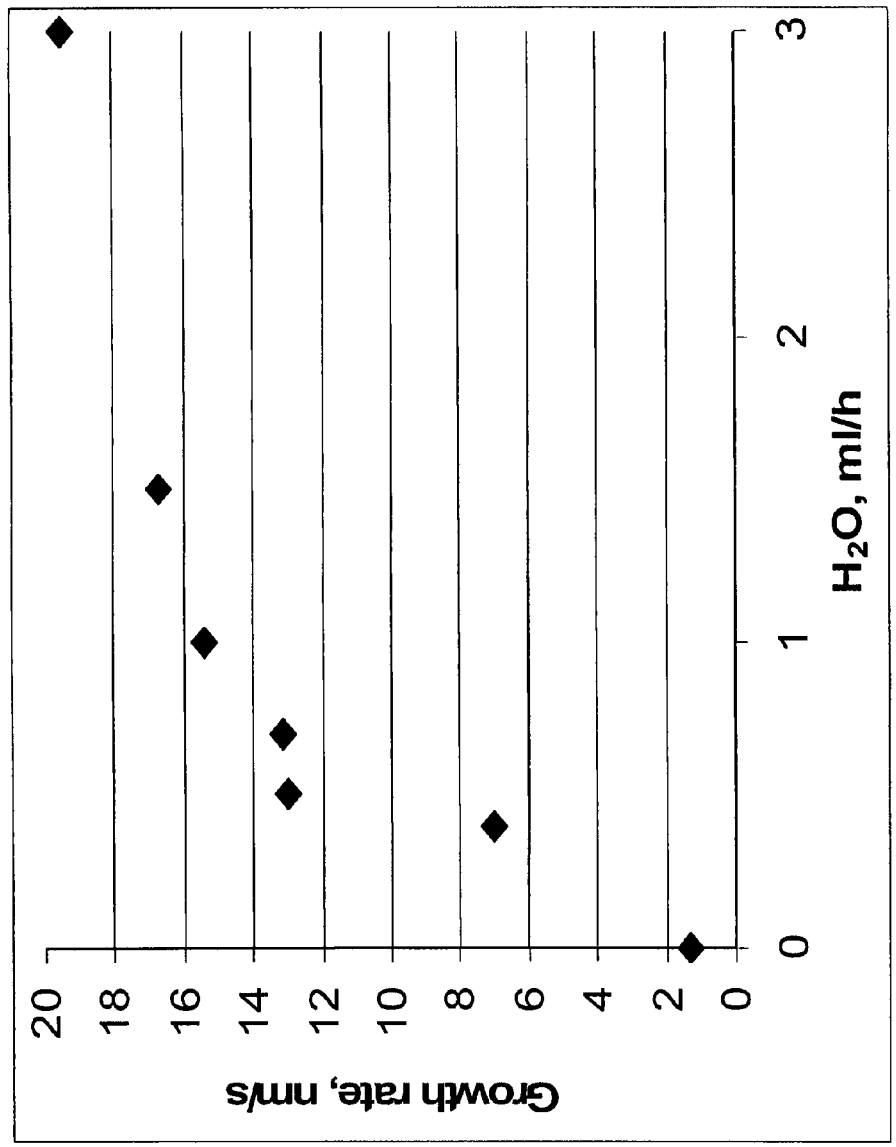
FIG. 2 is a graphical representation of zinc oxide film growth rate vs water concentration of the several Examples, in accordance with the invention.
Figure 3:
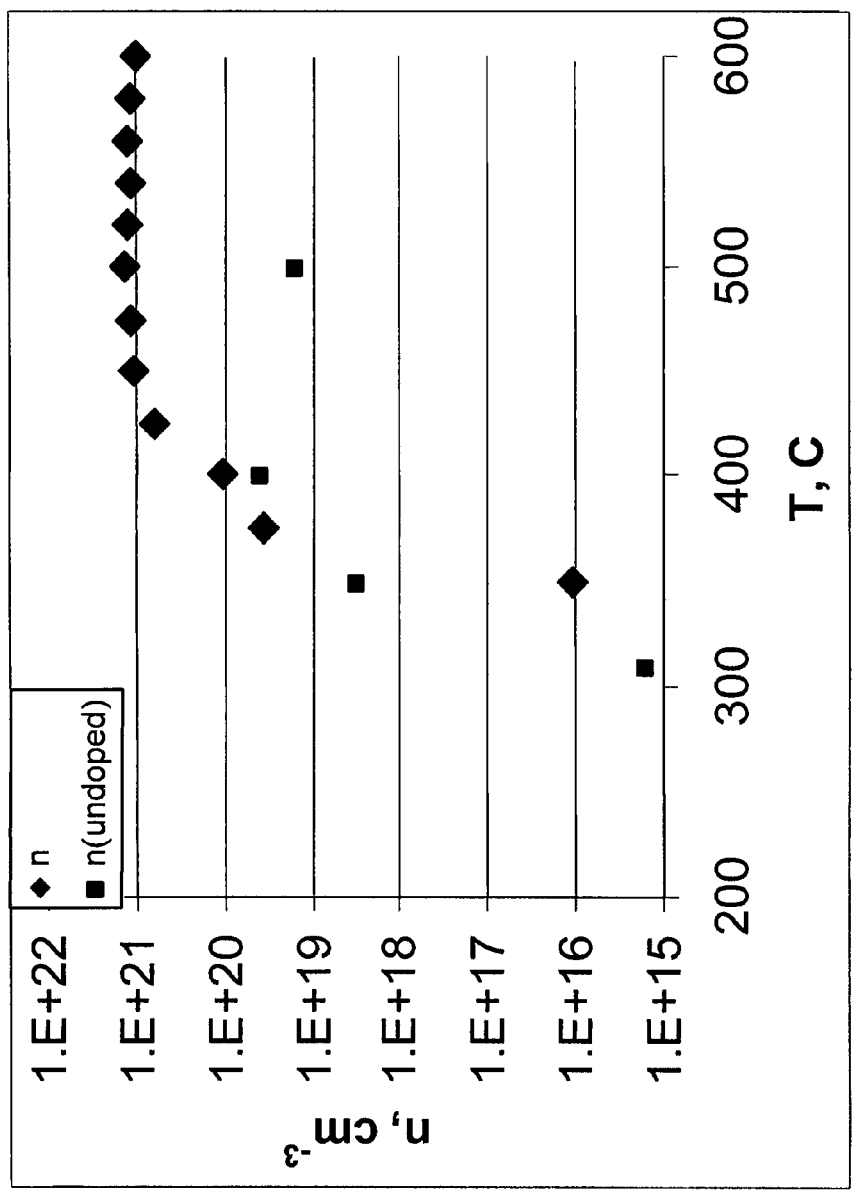
FIG. 3 is a graphical representation of electron concentration of the zinc oxide film vs deposition temperature of the several Examples, in accordance with the invention.
Figure 4:
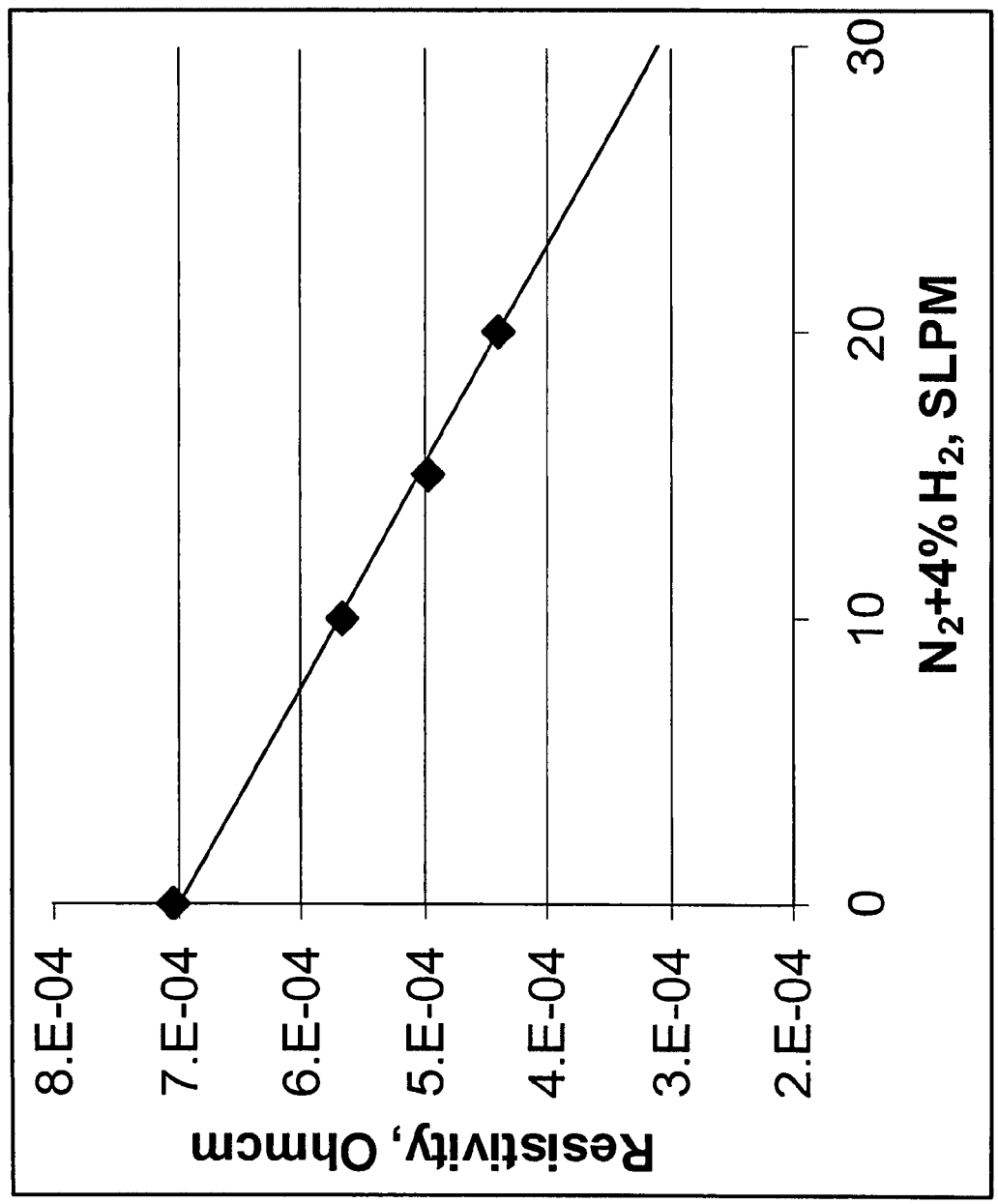
FIG. 4 is a graphical representation of the resistivity of the zinc oxide film vs substrate temperature in a reducing atmosphere, of the several Examples, in accordance with the invention.

The relationships between selected experimental conditions and output variables for doped ZnO deposition are depicted in FIGS. 1-4. The data in FIG. 1 graphically demonstrates the effect of Ga precursor delivery rate on electron concentration as well as the effect of temperature on electron concentration. The data in FIG. 2 indicates that film growth rate increases dramatically as water is increased. The data in FIG. 3 indicates that electon concentration optimization occurs at approximately 425° C. for doped ZnO and is constant to at least 600° C. The data in FIG. 4 demonstrates that cooling the substrate in a reducing atmosphere will retain the low resistivity of the doped ZnO film.

While this invention has been described with respect to various specific examples and embodiments, it is to be understood that the invention is not limited thereto, and that it can be variously practiced within the scope of the following claims.

What is claimed is:

1. A method of making a low-resistivity, doped zinc oxide coated glass article by chemical vapor deposition comprising:
providing a hot glass substrate having a surface on which a coating is to be deposited, the surface being at a temperature of at least 400° C. and atmospheric pressure;
controlling the premixing time of a zinc containing compound, water, and a dopant compound, wherein the dopant compound is an aluminum- or gallium-containing compound, and wherein the zinc containing compound and water are fed separately into a mixing chamber to form a gaseous precursor mixture; and
directing the gaseous precursor mixture to the surface on which the coating is to be deposited as the substrate moves past the mixing chamber, wherein the gaseous precursor mixture is premixed in the mixing chamber for less than 1 second such that an aluminum- or gallium-doped zinc oxide coating is formed on the surface at a deposition rate of greater than 5 nm/second.

2. The method according to claim 1, wherein the aluminum or gallium containing compound comprises an aluminum containing compound.

3. The method according to claim 2, wherein the aluminum containing compound comprises an aluminum compound of the formula:
$R^9_{(3-n)}Al(R^{10}C(O)CR^{11}C(O)R^{12})_n$ or $R^9_3Al(L)$ where $R^9$ is an alkyl or aryl or halide or alkoxide group, $R^{10-12}$ may be the same or different and are H, alkyl, or aryl groups (including cyclic and partially- and perfluorinated derivatives), where L is a oxygen-based, commercial, neutral ligand such as methyltrihydrofuran, tetrahydrofuran, furan, diethyl or dibutyl ether, dioxane and n=0-3.

4. The method according to claim 3, wherein the aluminum containing compound comprises diethylaluminumacetylacetonate.

5. The method according to claim 1, wherein the aluminum or gallium containing compound comprises a gallium containing compound.

6. The method according to claim 5, wherein the gallium containing compound comprises a gallium compound of the formula:
$R^9_{(3-n)}Ga(R^{10}C(O)CR^{11}C(O)R^{12})_n$ or $R^9_3Ga(L)$ where $R^9$ is an alkyl or aryl or halide or alkoxide group, $R^{10-12}$ may be the same or different and are H, alkyl, or aryl groups (including cyclic and partially- and perfluorinated derivatives), where L is a oxygen-based, commercial, neutral ligand such as methyltrihydrofuran, tetrahydrofuran, furan, diethyl or dibutyl ether, dioxane and n=0-3.

7. The method according to claim 6, wherein the gallium containing compound comprises dimethylgalliumhexafluoroacetylacetonate or dimethylgallium acetylacetonate.

8. The method according to claim 1, wherein the zinc containing compounds comprise zinc containing compounds of the general formula $R^1R^2Zn$ or $R^1R^2Zn[R^3R^4N(CHR^5)_n(CH_2)_m(CHR^6)_nNR^7R^8]$, where $R^{1-8}$ can be the same or different alkyl or aryl groups, such as methyl, ethyl, isopropyl, n-propyl, n-butyl, sec-butyl, phenyl or substituted phenyl, and may include one or more fluorine-containing substituents, $R^5$ and $R^{6'}$ can be H or alkyl or aryl groups, n can be 0 or 1, and m can be 1-6 if n is 0, and m can be 0-6 if n is 1.

9. The method of claim 1, wherein the gaseous precursor mixture further comprises an alcohol.

10. The method of claim 1, wherein the aluminum- or gallium-doped zinc oxide coating is formed so as to have an electron concentration which is greater than or equal to 4.80e18 $cm^{-3}$.

11. The method of claim 1, wherein the zinc containing compound and a dopant compound are combined prior to being fed into the mixing chamber.

12. The method of claim 1, wherein the mixing chamber includes a mixing zone with a definable length.

13. The method of claim 9, wherein the water/alcohol to zinc containing compound ratio in the precursor mixture is approximately 10:1.

14. The method of claim 1, wherein the water to zinc containing compound ratio in the precursor mixture is greater than 24:1.

* * * * *